US008155616B2

(12) United States Patent
Hayes et al.

(10) Patent No.: US 8,155,616 B2
(45) Date of Patent: Apr. 10, 2012

(54) REDUCTION OF NEAR FIELD ELECTRO-MAGNETIC SCATTERING USING HIGH IMPEDANCE METALLIZATION TERMINATIONS

(75) Inventors: James Gerard Hayes, Wake Forest, NC (US); Scott Ladell Vance, Cary, NC (US)

(73) Assignee: Sony Mobile Communications AB, Lund (SE)

( * ) Notice: Subject to any disclaimer, the term of this patent is extended or adjusted under 35 U.S.C. 154(b) by 956 days.

(21) Appl. No.: 12/121,828

(22) Filed: May 16, 2008

(65) Prior Publication Data

US 2008/0214136 A1 Sep. 4, 2008

Related U.S. Application Data

(62) Division of application No. 10/710,876, filed on Aug. 10, 2004, now Pat. No. 7,376,408.

(51) Int. Cl.
*H04B 1/10* (2006.01)
*H01P 1/22* (2006.01)

(52) U.S. Cl. ............................ 455/300; 333/12; 361/818

(58) Field of Classification Search .................. 455/300, 455/301; 361/760, 761, 763, 777, 816, 818; 333/12, 167, 202
See application file for complete search history.

(56) References Cited

U.S. PATENT DOCUMENTS

| | | | |
|---|---|---|---|
| 5,926,377 A | | 7/1999 | Nakao et al. |
| 5,966,294 A | | 10/1999 | Harada et al. |
| 6,150,895 A | * | 11/2000 | Steigerwald et al. ............ 333/12 |
| 6,215,373 B1 | | 4/2001 | Novak et al. |
| 6,557,154 B1 | | 4/2003 | Harada et al. |
| 6,668,025 B1 | | 12/2003 | Sumi et al. |
| 6,775,122 B1 | | 8/2004 | Dishonigh et al. |
| 6,791,434 B2 | | 9/2004 | Tsujiguchi |
| 6,870,436 B2 | | 3/2005 | Grebenkemper |
| 7,180,718 B2 | | 2/2007 | Anthony et al. |
| 7,366,554 B2 | * | 4/2008 | Hayes ........................ 455/575.5 |
| 2005/0104678 A1 | * | 5/2005 | Shahparnia et al. ............ 333/12 |
| 2005/0227665 A1 | * | 10/2005 | Murray et al. ................. 455/333 |
| 2006/0009156 A1 | * | 1/2006 | Hayes et al. ................. 455/63.1 |

FOREIGN PATENT DOCUMENTS

| | | |
|---|---|---|
| JP | 6214799 A | 1/1987 |
| JP | 63305597 A | 12/1988 |
| JP | 4189695 A | 7/1992 |
| JP | 2008509633 A | 3/2008 |

OTHER PUBLICATIONS

Sony Ericsson Mobile Communications AB, et al., International Application No. PCT/US2005/006509, "International Search Report" Aug. 19, 2005.

(Continued)

*Primary Examiner* — Blane J Jackson
(74) *Attorney, Agent, or Firm* — Sreenivas Vedantam; Moore & Van Allen, PLLC

(57) ABSTRACT

The present invention uses metallization termination techniques to reduce the electro-magnetic field scattering at the edges of metallized areas. The metallization termination techniques provide a gradual transition from high conductivity areas to high impedance areas. The mobile phone antenna illuminates the PCB allowing currents to flow on the PCB. When the currents reach edges of the PCB they flow through a region of increasingly high impedance without reflecting back or scattering.

8 Claims, 3 Drawing Sheets

OTHER PUBLICATIONS

Sony Ericsson Mobile Communications AB, et al., International Application No. PCT/US2005/006509, "Written Opinion" Aug. 19, 2005.
Sony Ericsson Mobile Communications AB, et al., International Application No. PCT/US2005/006509, "International Report on Patentability" Nov. 9, 2006.
Japanese Patent Office; Decision of Rejection; Dec. 3, 2010; issued in Japanese Patent Application No. 2007-525596.
Japanese Patent Office; Official Action; Jun. 7, 2010; issued in Japanese Patent Application No. 2007-525596.

* cited by examiner

REDUCTION OF NEAR FIELD ELECTRO-MAGNETIC SCATTERING USING HIGH IMPEDANCE METALLIZATION TERMINATIONS

CROSS REFERENCE TO RELATED APPLICATION

This application is a divisional application of U.S. patent application Ser. No. 10/710,876, for "Reduction of Near Field Electro-Magnetic Scattering Using High Impedance Metallization Terminations," filed on Aug. 10, 2004, and that will issue as U.S. Pat. No. 7,376,408, on May 20, 2008, which is incorporated by reference herein in its entirety.

BACKGROUND

The United States Federal Communications Commission (FCC) is set to enact new regulations in 2005 to improve hearing aid compatibility (HAC) for hearing impaired users of mobile phones. As part of mobile phone HAC assessment, near field components of electro-magnetic fields are measured. The components are comprised of electric and magnetic fields.

FIG. 3 illustrates a typical electric field distribution for a flip-type mobile phone having a near field scan area as shown in FIG. 1 and a PCB outline as shown in FIG. 2. The dominant electric fields tend to occur at abrupt discontinuities of metallization such as at the edges of printed circuit boards (PCBs), shield cans, vibrators, and metallization patterns on the assembly. These discontinuities form concentrated electric currents on the metallic substrates that flow toward the edges of a substrate. When the current reaches an edge of a substrate, undesirable scattering of electro-magnetic fields occurs. The greater the magnitude of scattered fields, the more likely they are to interfere with hearing aid devices.

What is needed is a method, means, or apparatus for reducing the undesirable effects of electro-magnetic scattering at metallic discontinuities that exist within mobile phone designs.

SUMMARY OF INVENTION

The present invention uses metallization termination techniques to reduce the electro-magnetic field scattering at the edges of metallized areas including the PCB and metallized housing assemblies. The metallization termination techniques present a gradual transition from high conductivity areas to high impedance areas. The mobile phone antenna illuminates the PCB allowing currents to flow on the PCB. When the currents reach edges of the PCB they flow through a region of increasingly high impedance without reflecting back or scattering.

DETAILED DESCRIPTION

In a related patent application, a high impedance translucent coating was used to attenuate RF surface waves (electro-magnetic scattering) over a desired region. Such a configuration is effective for attenuating the electric field in the near field region. It also attenuates the generation of surface currents in that region. For improved antenna performance, it may be desirable to allow surface currents to flow on a region of the mobile phone such as the top portion of a flip phone. However, these currents generate scattered electro-magnetic fields at abrupt discontinuities of the PCB and other metallized areas.

As part of hearing aid compatibility (HAC) assessment, near-field components of electromagnetic fields are measured. These components comprise electric and magnetic fields.

Figure 1:
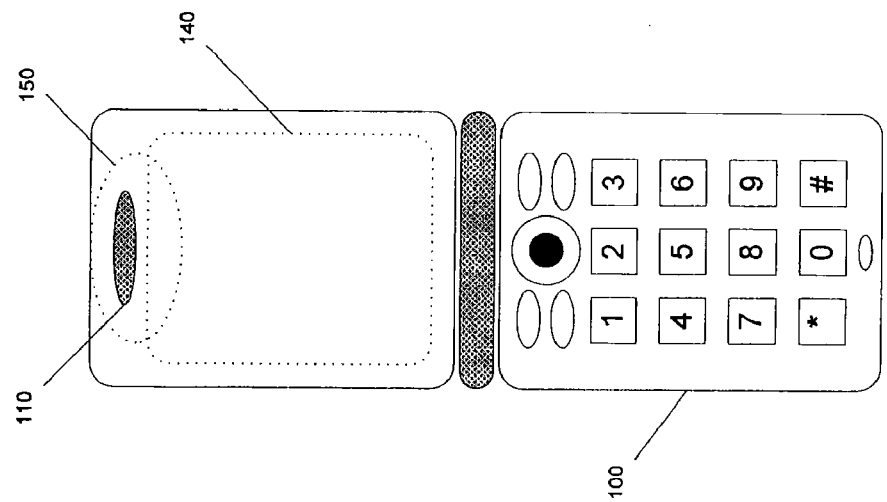
FIG. 1 is an illustration of a typical flip type mobile phone having a specified near field scan area.
Figure 2:
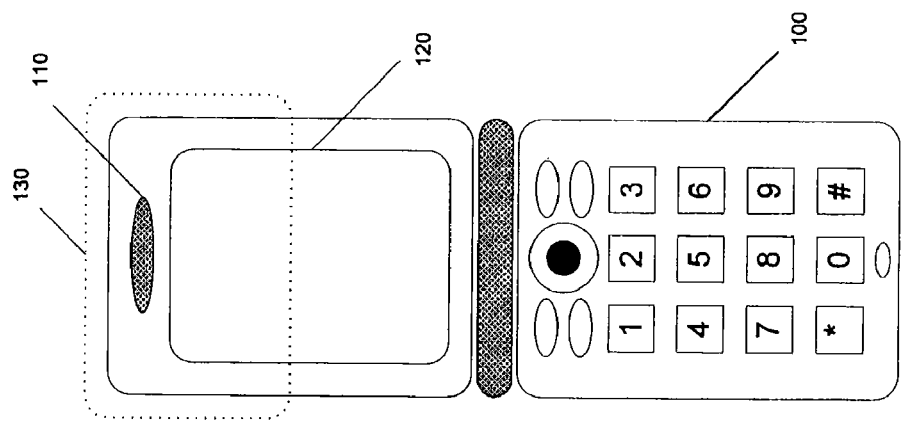
FIG. 2 is an illustration of a typical flip type mobile phone with a sample PCB outline depicted and showing an area of high field occurrence.

FIG. 1 is an illustration of a typical flip type mobile phone 100 showing an outline of a near field scan area 130 in the top-flip around the speaker component 110 and partially encompassing the mobile phone's display 120. This is the area of greatest concern since it is the point at which a user with a hearing aid will be in closest proximity to the electro-magnetic scattering effect. FIG. 2 is an illustration of the same mobile phone 100 further showing a high field area 150 about the mobile phone's speaker 110 and an outline of an underlying printed circuit board (PCB) 140. The relatively high fields are primarily the result of metallization discontinuities present in some of the underlying mobile phone components such as the PCB 140.

Figure 3:
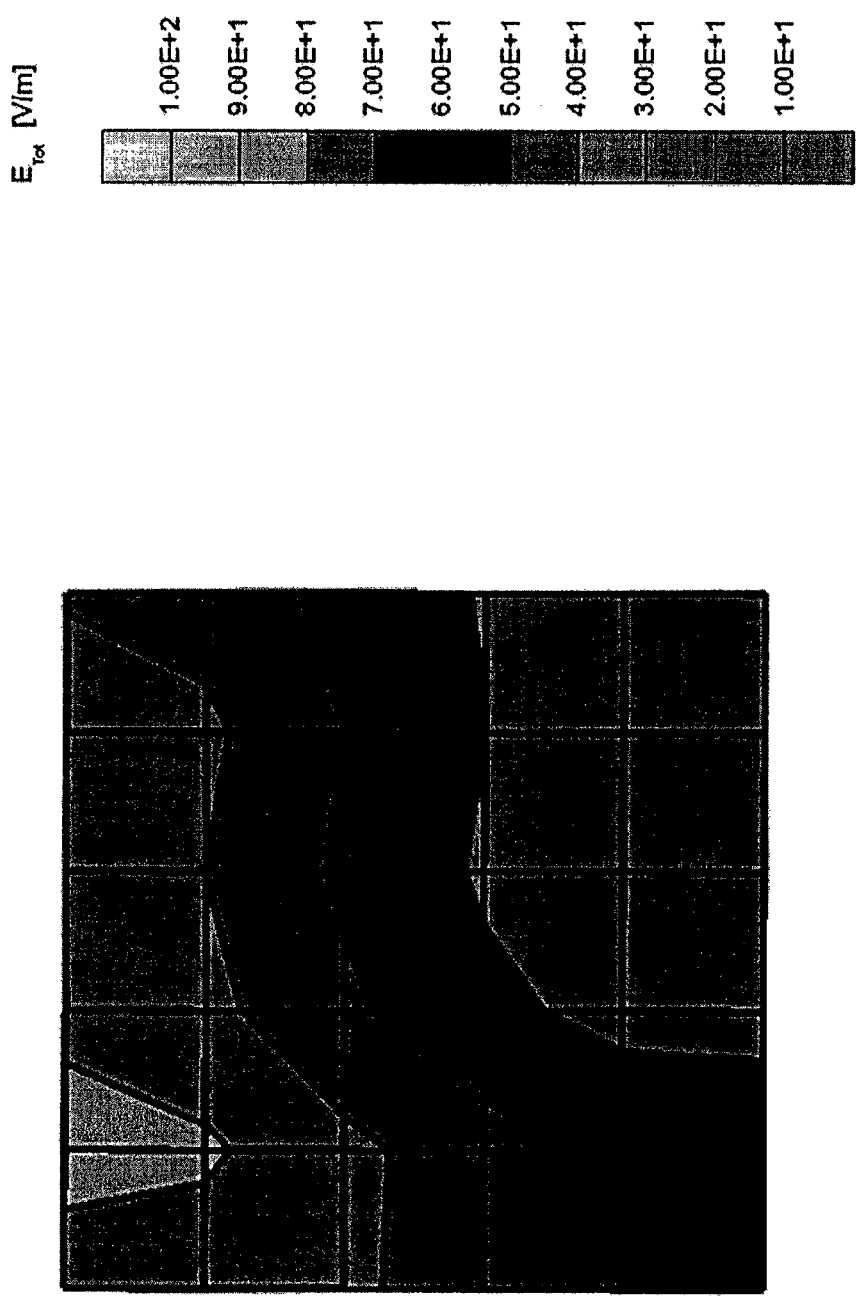
FIG. 3 is a graph of a measured electric field for a specified near field scan area of a flip type mobile phone.

A sample electric field distribution for the mobile phone 100 of FIGS. 1 and 2 is presented in FIG. 3. The dominant electric fields occur at abrupt discontinuities of metallization such as, but not limited to, the edge of the printed circuit board (PCB), edge of shield cans, speakers, vibrators, and the edge of metallization patterns on the assembly. These discontinuities establish concentrated points of electromagnetic scattering. The radiation from the mobile phone's antenna excites currents on the metallic substrates that flow towards the edge of the substrate. When the currents hit the edge of the substrate, scattering fields are generated.

The present invention uses metallization termination techniques to attenuate electro-magnetic field scattering at the edges of metallized areas. The metallization termination techniques provide a gradual transition from high conductivity areas to high impedance areas. The mobile phone antenna illuminates the PCB allowing currents to flow on the PCB. When the currents reach edges of the PCB they flow through a region of increasingly high impedance without reflecting back or scattering.

Figure 4:
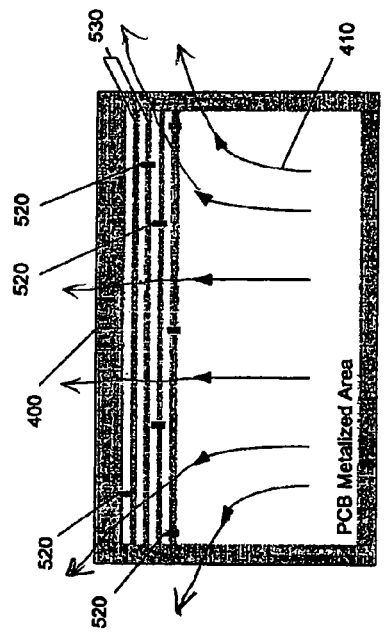
FIG. 4 illustrates one embodiment resulting in high impedance and high conductivity areas on a metallized area within a mobile phone.

FIG. 4 illustrates one embodiment of the present invention resulting in high impedance and high conductivity areas on a metallized area 400 within a mobile phone. In this embodiment electro-magnetic scattering 410 is attenuated at metallization edges by varying the metallization pattern 420. As the electro-magnetic waves scatter 410 towards the edge of the metallized area 400, they encounter progressively higher impedances 420 in the form of resistive materials. As a result, a higher impedance path is presented toward the edge of the metallized area 400.

Figure 5:
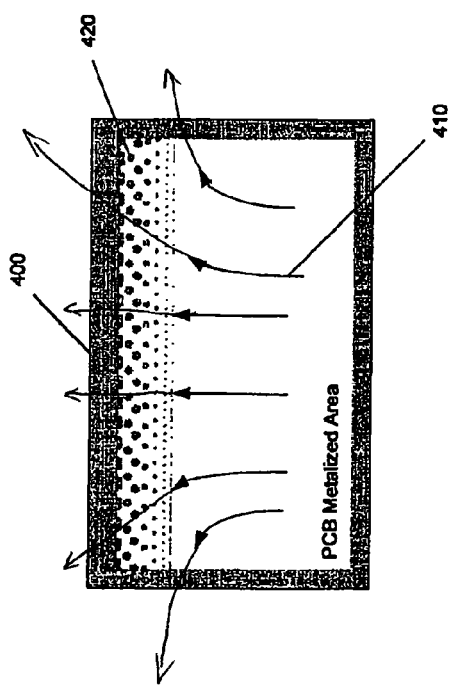
FIG. 5 illustrates another embodiment resulting in high impedance and high conductivity areas on a metallized area within a mobile phone.

FIG. 5 illustrates another embodiment resulting in high impedance and high conductivity areas on a metallized area 400 within a mobile phone. In this embodiment electro-magnetic scattering 410 is attenuated at metallization edges by controlling the current path near the edge. Discrete components 520 such as resistors, inductors, or capacitors are used to control impedance. Strips of metallization 530 are used to control the current path that is followed by the scattering electro-magnetic surface waves 410. The discrete components 520 essentially obstruct the current path thereby attenuating the electro-magnetic waves by requiring them to use up much of their energy to get through the obstruction.

Figure 6:
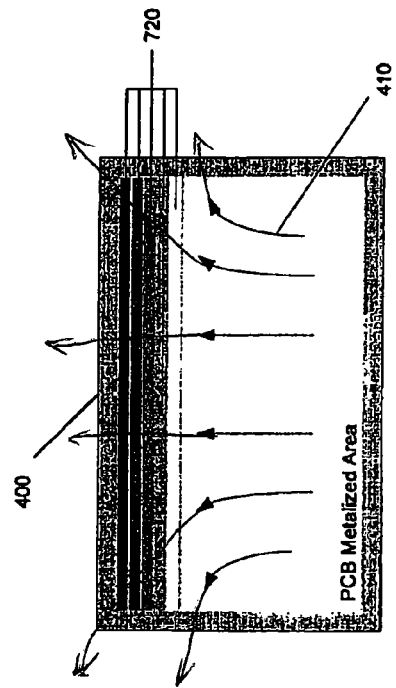
FIG. 6 illustrates yet another embodiment resulting in high impedance and high conductivity areas on a metallized area within a mobile phone.

FIG. 6 illustrates yet another embodiment resulting in high impedance and high conductivity areas on a metallized area 400 within a mobile phone. In this embodiment electro-magnetic scattering 410 is similarly attenuated at metallization edges by controlling the current path near the edge. This time, capacitive gaps 620 and inductive lines 630 are used to control the impedance near the edge. This results in the electro-magnetic waves 410 having to expend significant energy to overcome the obstructions (capacitive gaps 620 and inductive lines 630) resulting in their attenuation.

Figure 7:
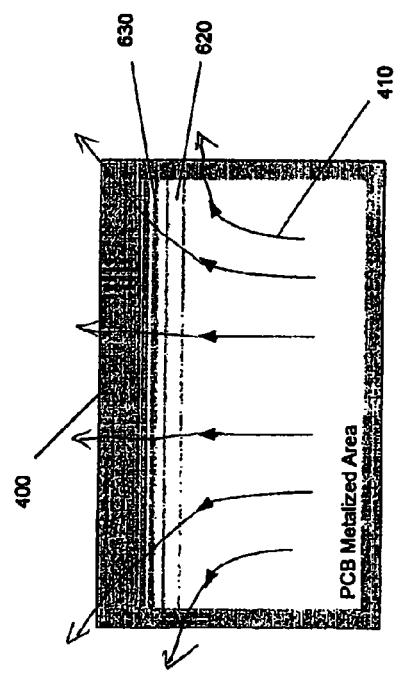
FIG. 7 illustrates still another embodiment resulting in high impedance and high conductivity areas on a metallized area within a mobile phone.

FIG. 7 illustrates still another embodiment resulting in high impedance and high conductivity areas on a metallized area 400 within a mobile phone. In this embodiment electro-magnetic scattering 410 is again attenuated at metallization edges. Various degrees of conductivity layers 720 are used to control and vary impedance near the edge. Progressively higher impedances are encountered as the current from the scattering electro-magnetic waves flows toward the edge of the metallized area 400.

Embodiments of the present invention include a method of attenuating scattering electro-magnetic waves present on metallized areas within a mobile phone that are caused by components within the mobile phone, the method comprising varying the metallization pattern near an edge of the metallized area such that electric current due to scattering electromagnetic waves present on the metallized area encounters higher impedances as it approaches the edge of the metallized area.

Embodiments of the present invention include a method of attenuating scattering electro-magnetic waves present on metallized areas within a mobile phone that are caused by components within the mobile phone, the method comprising placing capacitive gaps and inductive lines near an edge of the metallized area such that electric current due to scattering electro-magnetic waves present on the metallized area encounters higher impedances due to the capacitive gaps and inductive lines near the edge of the metallized area.

Embodiments of the present invention include a mobile phone that attenuates scattering electro-magnetic waves present on metallized areas within the mobile phone that are caused by components within the mobile phone, the mobile phone comprising: a varied metallization pattern near an edge of metallized areas such that electric current due to scattering electro-magnetic waves present on the metallized areas encounters higher impedances as it approaches the edge of the metallized areas.

Embodiments of the present invention include a mobile phone that attenuates scattering electro-magnetic waves present on metallized areas within the mobile phone that are caused by components within the mobile phone, the mobile phone comprising: capacitive gaps and inductive lines placed near an edge of metallized areas such that electric current due to scattering electro-magnetic waves present on the metallized areas encounters higher impedances due to the capacitive gaps and inductive lines near the edge of the metallized areas.

The invention claimed is:

1. A method to enable a hearing impaired user of a mobile phone to use the mobile phone, the method comprising:
   reducing an interference of electromagnetic waves scattered from an edge of a metallized area in the mobile phone with a hearing aid device associated with the hearing impaired user of the mobile phone, wherein the reducing comprises:
      attenuating electromagnetic waves scattered from the edge of the metallized area in the mobile phone, wherein the attenuating comprises:
         providing, on the metallized area, metallization strips to control a current path followed by the scattering electromagnetic waves; and
         providing, on the metallized area, discrete components that obstruct the current path and cause the scattering electromagnetic waves to lose their energy.

2. The method of claim 1, wherein the attenuating further comprises:
   providing resistive materials on the metallized area, such that the scattering electromagnetic waves encounter progressively higher impedance as the scattering electromagnetic waves travel from a center of the metallized area towards the edge of the metallized area.

3. The method of claim 1, wherein the attenuating further comprises:
   providing capacitive gaps and inductive lines on the metallized area such that the scattering electromagnetic waves encounter intervals of lower and higher impedance as the scattering electromagnetic waves travel from a center of the metallized area towards the edge of the metallized area.

4. The method of claim 1, wherein the attenuating further comprises:
   providing conductive layers on the metallized area such that the scattering electromagnetic waves encounter progressively higher impedance as the scattering electromagnetic waves travel from a center of the metallized area towards the edge of the metallized area.

5. A mobile phone that enables a hearing impaired user to use the mobile phone, the mobile phone being configured to reduce an interference of electromagnetic waves scattered from an edge of a metallized area in the mobile phone with a hearing aid device associated with the hearing impaired user of the mobile phone, wherein in order to reduce the interference, the mobile phone is configured to attenuate electromagnetic waves scattered from the edge of the metallized area, the mobile phone further comprising:
   a speaker of the mobile phone located in an electromagnetic field produced by the electromagnetic waves scattered from the edge of the metallized area;
   metallization strips, situated on the metallized area, that control a current path followed by the scattering electromagnetic waves; and
   discrete components, situated on the metallized area, that obstruct the current path and cause the scattering electromagnetic waves to lose their energy.

6. The mobile phone of claim 5, further comprising:
   resistive materials on the metallized area, such that the scattering electromagnetic waves encounter progressively higher impedance as the scattering electromagnetic waves travel from a center of the metallized area towards the edge of the metallized area.

7. The mobile phone of claim 5, further comprising:
capacitive gaps and inductive lines on the metallized area such that the scattering electromagnetic waves encounter intervals of lower and higher impedance as the scattering electromagnetic waves travel from a center of the metallized area towards the edge of the metallized area.

8. The mobile phone of claim 5, further comprising:
conductive layers on the metallized area such that the scattering electromagnetic waves encounter progressively higher impedance as the scattering electromagnetic waves travel from a center of the metallized area towards the edge of the metallized area.

* * * * *

UNITED STATES PATENT AND TRADEMARK OFFICE
CERTIFICATE OF CORRECTION

PATENT NO. : 8,155,616 B2  
APPLICATION NO. : 12/121828  
DATED : April 17, 2012  
INVENTOR(S) : Gerard James Hayes et al.

Page 1 of 1

It is certified that error appears in the above-identified patent and that said Letters Patent is hereby corrected as shown below:

Cover page, item (75), change "James Gerard Hayes" to "Gerard James Hayes".

Signed and Sealed this  
Twenty-second Day of May, 2012

David J. Kappos  
*Director of the United States Patent and Trademark Office*